United States Patent
Lee et al.

(10) Patent No.: US 8,553,448 B2
(45) Date of Patent: Oct. 8, 2013

(54) SRAM CELLS, MEMORY CIRCUITS, SYSTEMS, AND FABRICATION METHODS THEREOF

(75) Inventors: Chen Hung Lee, Hsinchu (TW); Hung-Jen Liao, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/609,930

(22) Filed: Sep. 11, 2012

(65) Prior Publication Data

US 2013/0003445 A1    Jan. 3, 2013

Related U.S. Application Data (63) Continuation of application No. 12/877,695, filed on Sep. 8, 2010, now Pat. No. 8,289,754.

(60) Provisional application No. 61/242,167, filed on Sep. 14, 2009.

(51) Int. Cl.
     *G11C 11/00*          (2006.01)

(52) U.S. Cl.
     USPC .............................. 365/154; 365/188; 365/63

(58) Field of Classification Search
     USPC ............................................ 365/154, 188, 63
     See application file for complete search history.

(56) References Cited

U.S. PATENT DOCUMENTS

| | | | |
|---|---|---|---|
| 5,715,191 A | 2/1998 | Yamauchi et al. | |
| 8,098,533 B2 | 1/2012 | Nii et al. | |
| 8,363,454 B2 * | 1/2013 | Wang et al. | 365/154 |
| 2009/0010053 A1 * | 1/2009 | Chiu et al. | 365/182 |
| 2011/0026308 A1 * | 2/2011 | Liaw | 365/154 |
| 2011/0058428 A1 * | 3/2011 | Takashima | 365/188 |
| 2012/0014171 A1 * | 1/2012 | Chuang et al. | 365/154 |
| 2012/0195105 A1 * | 8/2012 | Wang et al. | 365/154 |
| 2013/0107609 A1 * | 5/2013 | Chang et al. | 365/154 |

* cited by examiner

*Primary Examiner* — Tuan T. Nguyen
(74) *Attorney, Agent, or Firm* — Lowe Hauptman & Ham, LLP (57) ABSTRACT

A static random access memory (SRAM) cell includes a pair of cross-coupled inverters having a first node and a second node. A first transistor is coupled between the first node and a first bit line. A second transistor is coupled between the second node and a second bit line. A third transistor is coupled with the first node. The third transistor has a threshold voltage that is higher than that of a fourth transistor of the pair of cross-coupled inverters by about 10% or more. A fifth transistor is coupled between the third transistor and a third bit line.

20 Claims, 6 Drawing Sheets

SRAM CELLS, MEMORY CIRCUITS, SYSTEMS, AND FABRICATION METHODS THEREOF

CROSS-REFERENCE TO RELATED APPLICATIONS

This application is a continuation of U.S. application Ser. No. 12/877,695, filed Aug. 8, 2010, which in turn claims priority of U.S. Provisional Patent Application Ser. No. 61/242,167, filed on Sep. 14, 2009, which are incorporated herein by reference in their entirties.

TECHNICAL FIELD

The present disclosure relates generally to the field of semiconductor circuits, and more particularly, to SRAM cells, SRAM circuits, systems, and fabrication methods thereof.

BACKGROUND

Semiconductor memory devices include, for example, static random access memory, or SRAM, and dynamic random access memory, or DRAM. DRAM memory cell has only one transistor and one capacitor, so it provides a high degree of integration. DRAM requires constant refreshing. Also, its power consumption and slow speed limit its use mainly for computer main memories. An SRAM cell, on the other hand, is bi-stable, meaning it can maintain its state indefinitely as long as an adequate power is supplied. SRAM can operate at a higher speed and lower power dissipation, so computer cache memories use exclusively SRAMs. Other applications include embedded memories and networking equipment memories. There are several types of SRAM cells, e.g., 6-transistor (6T) SRAM, dual-port 8-transistor (8T) SRAM, etc.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

A conventional eight-transistor (8T) SRAM cell consists of eight metal-oxide-semiconductor (MOS) transistors. The conventional 8T SRAM cell has two identical cross-coupled inverters that form a latch circuit, i.e., one inverter's output connected to the other inverter's input. The latch circuit is connected between a power and a ground. Each inverter consists of an NMOS pull-down transistor and a PMOS pull-up transistor. The inverters' outputs serve as two storage nodes. One is pulled to a low voltage and the other is pulled to a high voltage. A complementary write bit-line pair is coupled to the pair of storage nodes via a pair of write pass-gate NMOS transistors. The gates of the write pass-gate NMOS transistors are commonly connected to a write word line.

The conventional 8T SRAM cell also has a read pass-gate NMOS transistor coupled to a read bit line. A gate of the read pass-gate NMOS transistor is coupled to a read word line. An NMOS transistor has a gate coupled to one of the storage nodes. The source of the NMOS transistor is grounded. The drain of the NMOS transistor is coupled to the source of the read pass-gate NMOS transistor. Conventionally, the NMOS transistor, the NMOS pull-down transistors, the read pass-gate NMOS transistor, and the write pass-gate NMOS transistors are formed by the same channel ion implantation and have the same threshold voltage. It is found that writing a datum to a conventional 8T SRAM cell may result in misreading a datum stored within another conventional 8T SRAM cell that is disposed on the same column of the former.

Based on the foregoing, SRAM cells, SRAM circuits, systems, and fabrication methods thereof are desired.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1:
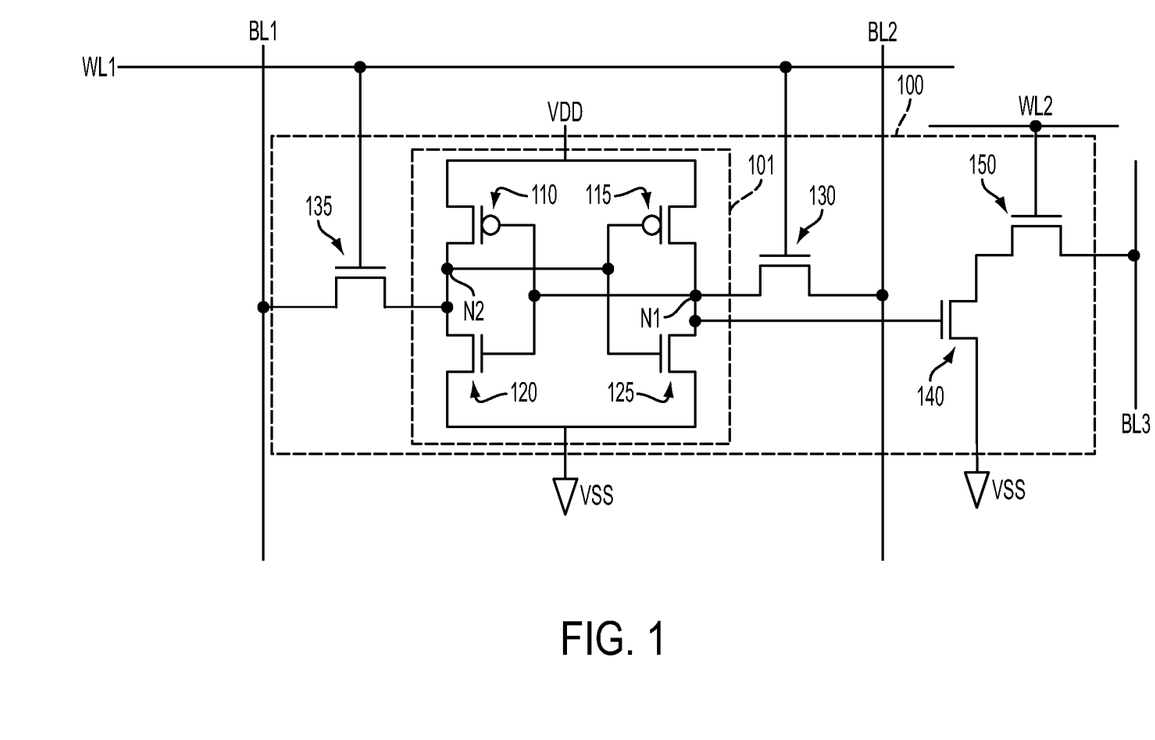
FIG. 1 is a schematic drawing illustrating an exemplary static random access memory (SRAM) cell.

FIG. 1 is a schematic drawing illustrating an exemplary static random access memory (SRAM) cell. In FIG. 1, a SRAM cell 100 can include a pair of cross-coupled inverters 101. The cross-coupled inverters 101 can have nodes N1 and N2. The SRAM cell 100 can include a transistor 130 coupled between the node N1 and a bit line BL2. The SRAM cell 100 can include a transistor 135 coupled between the node N2 and a bit line BL1. The SRAM cell 100 can include a transistor 140 coupled with the node N1. The SRAM cell 100 can include a transistor 150 coupled with the transistor 140 and a bit line BL3. The transistor 140 can have a threshold voltage $V_{th1}$ that is higher than a threshold voltage $V_{th2}$ of a transistor, e.g., a transistor 125, of the pair of cross-coupled inverters 101 by about 10% or more.

In some embodiments, the bit lines BL1 and BL2 can be a complementary bit line pair. The bit lines BL1 and BL2 can be referred to as a write bit line and a write bit line bar, respectively. The bit line BL3 can be referred to as a read bit line. The transistors 130 and 135 can be referred to as access transistors. In some embodiments, gates of the transistors 130 and 135 can be coupled with a word line WL1. A gate of the transistor 150 can be coupled with a word line WL2. The word lines WL1 and WL2 can be referred to as a write word line and a read word line, respectively.

Referring to FIG. 1, the pair of cross-coupled inverters 101 can include transistors, 110, 115, 120, and 125. The transistors 110 and 115, e.g., PMOS transistors, can be coupled with a power line that can provide a voltage state, e.g., VDD. The transistors 120 and 125, e.g., NMOS transistors, can be coupled with a power line that can provide another voltage state, e.g., VSS or ground. In some embodiments, the transistors 110 and 115 can be referred to as pull-up transistors. The transistors 120 and 125 can be referred to as pull-down transistors.

In some embodiments, the transistors 140 and 150 can be NMOS transistors. A gate of the transistor 140 can be coupled with the node N1. A source end of the transistor 140 can be coupled with a power line that can provide a voltage state, e.g., VSS or ground. A drain end of the transistor 140 can be coupled with a source end of the transistor 150. A drain end of the transistor 150 can be coupled with the bit line BL3. It is noted that the types of the transistors 110, 115, 120, 125, 130, 135, 140, and 150 described above are merely exemplary. One of skill in the art can modify the types of the transistors to achieve a desired dual-port SRAM cell.

Figure 2:
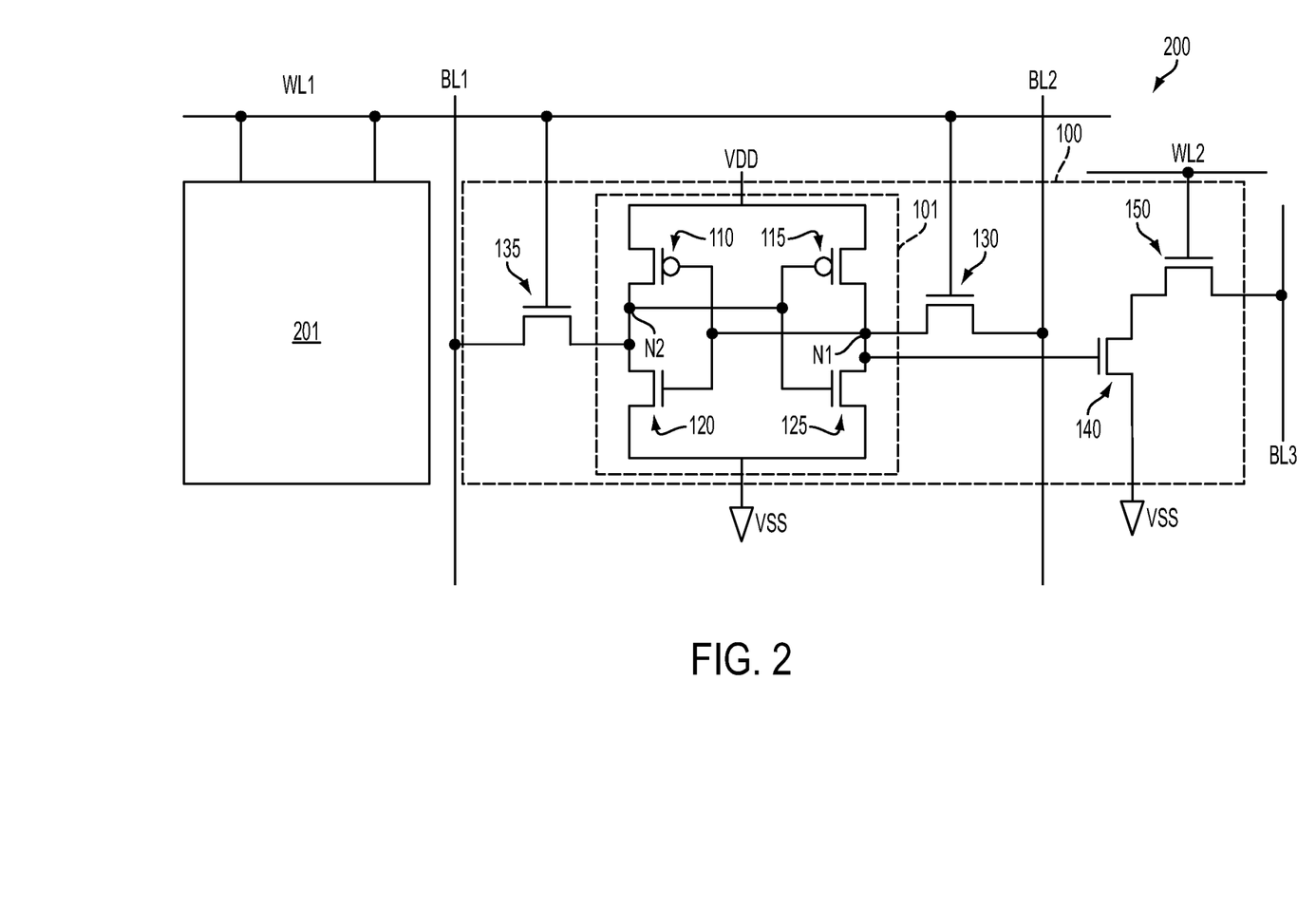
FIG. 2 is a schematic drawing illustrating an exemplary SRAM circuit including two SRAM cells coupled with the same word line.

FIG. 2 is a schematic drawing illustrating an exemplary SRAM circuit including two SRAM cells coupled with the same word line. In FIG. 2, a SRAM circuit 200 can include the SRAM cell 100 described above in conjunction with FIG. 1 and another SRAM cell 201. The SRAM cell 201 can have a cell structure similar to that of the SRAM cell 100. The SRAM cells 100 and 201 can be coupled with the word line WL1. In some embodiments, the SRAM cells 100 and 201 can be disposed on the same column.

It is noted that though only two SRAM cells 100 and 201 are depicted, other cells (not shown) can be placed at the intersection of a plurality of word lines and the bit lines. A portion of the memory circuit 200 may have 8, 16, 32, 64, 128 or more columns that can be arranged in word widths. In some embodiments, the word lines can be laid out substantially orthogonally to the bit lines. In some other embodiments, other arrangements of the word lines and bit lines can be provided.

Following is a description regarding an exemplary operation of the SRAM circuit 200. In some embodiments for reading data from the SRAM cell 100 and writing data into the SRAM cell 201, the bit lines BL1-BL3 can be precharged to a voltage state, e.g., VDD. In some embodiments, the node N1 can store a voltage state, e.g., a low voltage state or 0, and the node N2 can have another voltage state, e.g., a high voltage state or 1. It is noted that the precharged voltage state VDD and/or the voltage states of the nodes N1 and N2 are merely exemplary. In some embodiments, the precharged voltage state can be ½ VDD.

In some embodiments, writing a datum to the SRAM cell 201 and reading another datum stored within the SRAM cell 100 can be performed simultaneously. For writing the datum to the SRAM cell 201, the voltage state of the word line WL1 can be pulled up to a voltage state, e.g., VDD. For reading the datum stored in the SRAM cell 100, the voltage state of the word line WL 2 can be pulled up to a voltage state, e.g., VDD, for turning on the transistor 150.

As noted, the SRAM cell 100 is coupled with the word line WL1. The voltage VDD applied to the word line WL1 can turn on the transistors 130 and 135. The turned-on transistor 130 can couple the node N1 having the low state with the bit line BL2 that is precharged to the voltage state VDD. Since the node N1 has a low voltage state, the precharged voltage state of the bit line BL2 can pull up the voltage state on the node N1. The pulled-up voltage state on the node N1 is coupled with the gate of the transistor 140.

Figure 3:
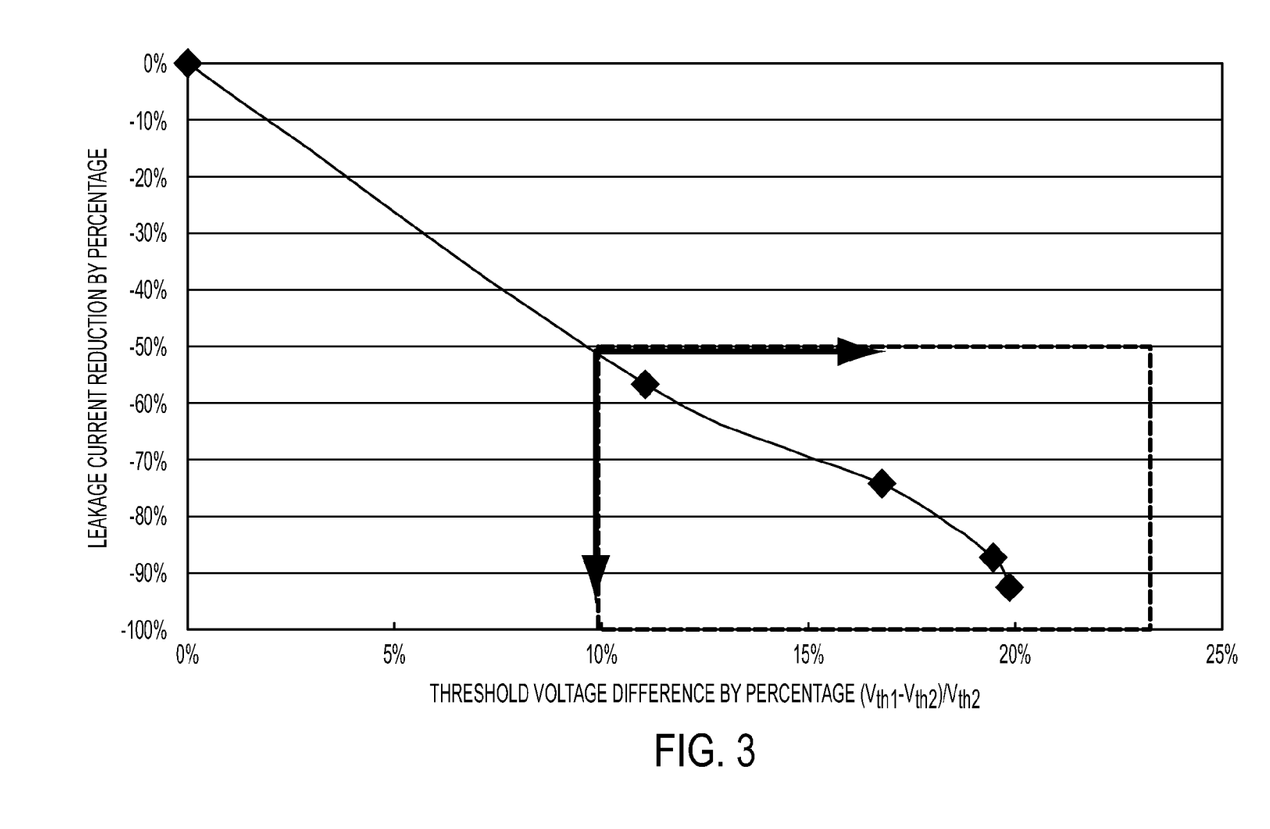
FIG. 3 is a schematic drawing illustrating a simulation result of the threshold voltage difference by percentage $(V_{th1}-V_{th2})/V_{th2}$ v.s. a leakage current reduction by percentage.

As noted, the threshold voltage $V_{th1}$ of the transistor 140 can be higher than the threshold voltage $V_{th2}$ of the transistor 125 by about 10% or more. The high threshold voltage $V_{th1}$ of the transistor 140 can desirably reduce the leakage current resulting from the pulled-up voltage state on the node N1. The reduction of leakage current can desirably let a sense circuit (not shown) to sense the stored state, e.g., the low state, on the node N1, instead of the pulled-up voltage state. The misreading of the datum stored in the SRAM cell 100 can be desirably reduced. FIG. 3 is a schematic drawing illustrating a simulation result of the threshold voltage difference by percentage $(V_{th1}-V_{th2})/V_{th2}$ v.s. a leakage current reduction by percentage. In FIG. 3, the horizontal axis can represent the threshold voltage difference by percentage $(V_{th1}-V_{th2})/V_{th2}$. The vertical axis can represent a leakage current reduction by percentage. The leakage current can include a leakage current flowing through the transistor 140. As shown in FIG. 3, the leakage current reduction by percentage can be substantially increased if the difference percentage of $(V_{th1}-V_{th2})/V_{th2}$ can be about 10% or more.

Referring again to FIG. 1, in some embodiments the threshold voltage $V_{th1}$ of the transistor 140 can be higher than a threshold voltage $V_{th3}$ of the transistor 150 by about 10% or more. In some other embodiments, the threshold voltage $V_{th1}$ of the transistor 140 can be higher than the threshold voltage $V_{th3}$ of the transistor 150 by about 20% or more. In still some other embodiments, the threshold voltage $V_{th3}$ of the transistor 150 can be substantially equal to threshold voltage $V_{th2}$ of the transistor 125. In still further embodiments, the threshold voltage $V_{th3}$ of the transistor 150 can be lower than the threshold voltage $V_{th2}$ of the transistor 125 by about 10% or more.

Instead of storing a low voltage state described above, in some other embodiments the node N1 can store a high voltage state. To sense the high voltage state on the node 1, the cell current is desired to reach a predetermined level. As noted, the threshold voltage $V_{th1}$ of the transistor 140 is higher than the threshold voltage $V_{th1}$ of the transistor 125 by about 10% or more. The high threshold voltage $V_{th1}$ of the transistor 125 may reduce the cell current. To compensate the low cell current resulting from the high threshold voltage $V_{th1}$ of the transistor 125, the threshold voltage $V_{th3}$ of the transistor 150 is reduced. With the lower threshold voltage $V_{th3}$ of the transistor 150, the cell current can be desirably achieved. The sense circuit (not shown) can desirably sense the stored high voltage on the node N1.

Figure 4:
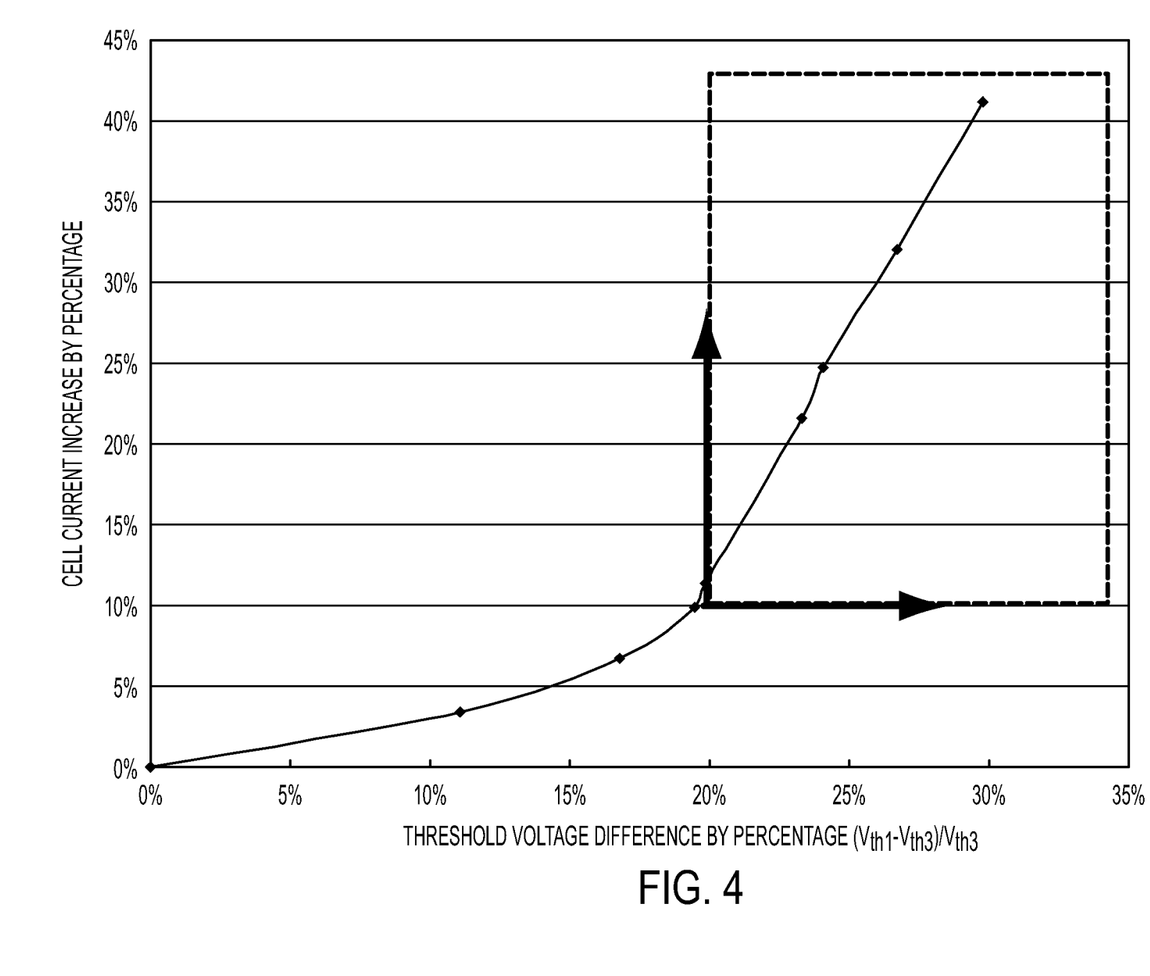
FIG. 4 is a schematic drawing illustrating a simulation result of the threshold voltage difference by percentage of $(V_{th1}-V_{th3})/V_{th3}$ v.s. a cell current increase by percentage.

FIG. 4 is a schematic drawing illustrating a simulation result of the threshold voltage difference by percentage of $(V_{th1}-V_{th3})/V_{th3}$ v.s. a cell current increase by percentage. In FIG. 4, the horizontal axis can represent the threshold voltage difference by percentage $(V_{th1}-V_{th3})/V_{th3}$. The vertical axis can represent a cell current increase by percentage. The cell current can include a cell current flowing through the transistor 140. As shown in FIG. 4, the cell current increase by percentage can be substantially enhanced if the difference percentage of $(V_{th1}-V_{th3})/V_{th3}$ can be about 20% or more.

Figure 5:
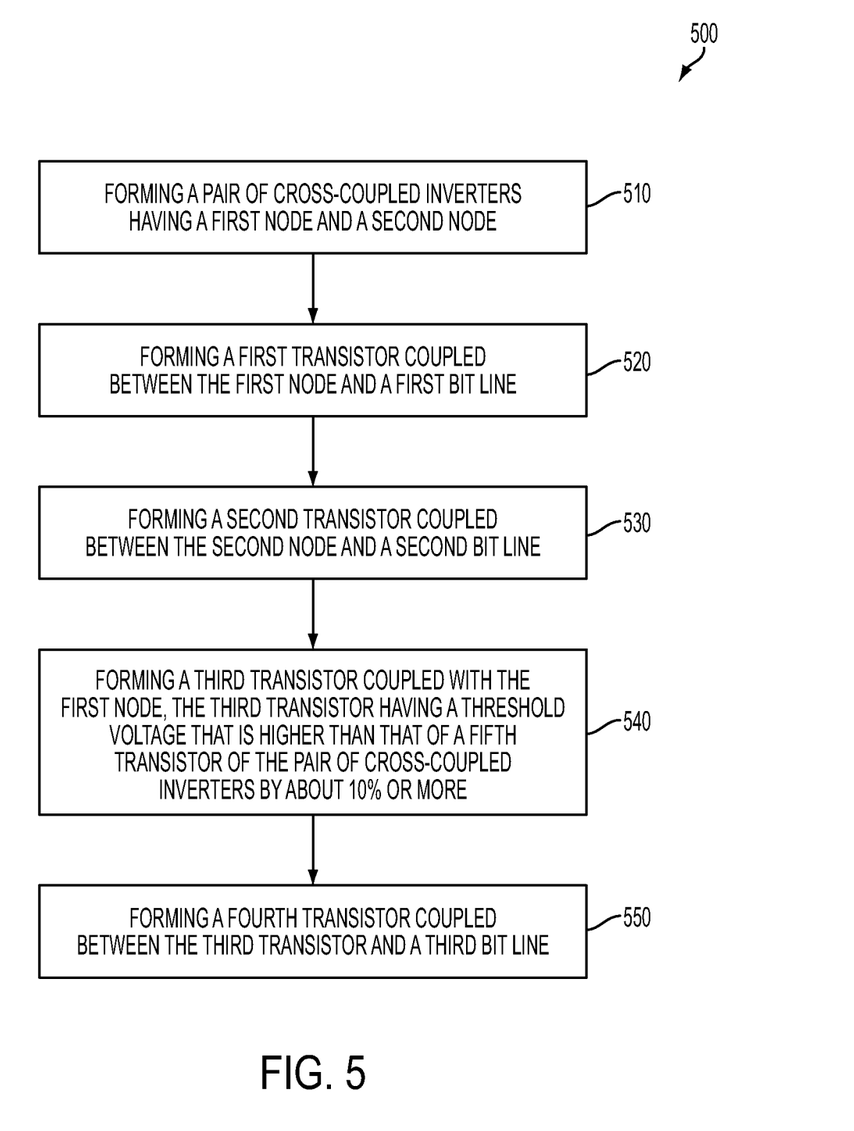
FIG. 5 is a flowchart illustrating an exemplary method for forming a SRAM cell.

FIG. 5 is a flowchart illustrating an exemplary method for forming a SRAM cell. In FIG. 5, a method 500 can include processes 510-550. The process 510 can form the pair of cross-coupled inverters 101 having the nodes N1 and N2 (shown in FIG. 1). The process 520 can form the transistor 130 coupled between the node N1 and the bit line BL2. The process 530 can form the transistor 135 coupled between the node N2 and the bit line BL1. The process 540 can form the transistor 140 coupled with the node N1. The transistor 140 can have the threshold voltage $V_{th1}$ that is higher than the threshold voltage $V_{th2}$ of the transistor 125 of the pair of cross-coupled inverters 101 by about 10% or more. The process 550 can form the transistor 150 coupled between the transistor 140 and the bit line BL3. In some embodiments, the processes 510, 520, 530, 540, and/or 550 can have the process flows that are similar to each other. In some other embodiments, the processes 510, 520, 530, 540, and/or 550 can be a single process that can form the cross-coupled inverters 101 and the transistors 130, 135, 140, and 150 simultaneously. The processes 510, 540, and/or 550 can have different channel implantation processes.

In some embodiments, the substrate (not shown) over which the SRAM cell 101 is formed can include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

In some embodiments, the method 500 can include defining an oxide definition (OD) region (not shown). The OD region can be defined by a STI process, a LOCOS process, or other suitable process that can form a desired isolation structure.

Areas around the OD region can include materials such as oxide, nitride, oxynitride, other dielectric material that can isolate the OD region from other OD regions, and/or any combinations thereof.

In some embodiments, implantation processes can be performed to implant dopants within the OD regions to achieve desired threshold voltages of the transistors. As noted, the transistor 140 can have the threshold voltage $V_{th1}$ that is higher than the threshold voltage $V_{th2}$ of the transistor 125. In some embodiments, the process 510 can include implanting a channel dopant in the transistor 125 such that the transistor 125 has a first channel dopant concentration. The process 540 can include implanting a channel dopant in the transistor 140 such that the transistor 140 can have a second channel dopant concentration. The second channel dopant concentration is higher than the first channel dopant concentration. In embodiments, implanting the channel dopant in the transistor 125 and implanting the channel dopant in the transistor 140 are different implantation processes. In some other embodiments, implanting the channel dopant in the transistor 125 can also implant channel dopant in the transistor 140. Implanting the channel dopant in the transistor 140 can implant more dopants in the channel of the transistor 140.

In some embodiments, the threshold voltage $V_{th1}$ of the transistor 140 is higher than a threshold voltage $V_{th3}$ of the transistor 150 by about 10% or more. For example, the process 550 can include implanting a channel dopant in the transistor 150 such that the transistor 150 has a third channel dopant concentration. The third channel dopant concentration is lower than the second channel dopant concentration. In some other embodiments, the third channel dopant concentration is substantially equal to the first channel dopant concentration.

In some other embodiments, the threshold voltage $V_{th1}$ of the transistor 140 is higher than a threshold voltage $V_{th3}$ of the transistor 150 by about 20% or more. The third channel dopant concentration is lower than the first channel dopant concentration.

In some embodiments, the word lines WL1 and WL2 can be formed using processes such as, deposition, photolithography, wet etching, dry etching (e.g., reactive ion etch (RIE)), plasma etching, and/or other suitable processes. The word lines WL1 and WL2 may include polysilicon, Ti, TiN, TaN, Ta, TaC, TaSiN, W, WN, MoN, MoON, $RuO_2$, and/or other suitable materials. The word lines WL1 and WL2 may include one or more layers formed by physical vapor deposition (PVD), CVD, ALD, plating, and/or other suitable processes.

In some embodiments, source/drain (S/D) regions (not labeled) of the transistors 110, 115, 120, 125, 130, 135, 140, and 150 can be formed by implanting dopants within the OD region. For embodiments forming N-channel memory cells, the S/D regions can have dopants such as Arsenic (As), Phosphorus (P), other group V element, or the combinations thereof. In some other embodiments, the S/D regions can include silicide for low resistances. The silicide may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. The materials utilized to create the silicide may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After deposition, the salicidation process may continue with a reaction between the deposited material and the doped regions at an elevated temperature that is selected based on the specific material or materials. This is also referred to as annealing, which may include a RTP. The reacted silicide may require a one step RTP or multiple step RTPs.

In some embodiments, at least one dielectric structure (not shown) can be formed over the substrate. The dielectric structure may include materials such as oxide, nitride, oxynitride, low-k dielectric material, ultra low-k dielectric material, or any combinations thereof. The dielectric structure may be formed by, for example, a CVD process, a HDP CVD process, a HARP, a spin-coating process, other deposition process, and/or any combinations thereof.

In some embodiments, contact plugs, via plugs, metallic regions, metallic lines, and/or the bit lines BL1-BL3 can be formed within the dielectric structure for interconnection. The contact plugs, via plugs, metallic regions, metallic lines, and/or the bit lines BL1-BL3 can include materials such as tungsten, aluminum, copper, titanium, tantalum, titanium nitride, tantalum nitride, nickel silicide, cobalt silicide, other proper conductive materials, and/or combinations thereof. The contact plugs, via plugs, metallic regions, metallic lines, and/or the bit lines BL1-BL3 can be formed by any suitable processes, such as deposition, photolithography, and etching processes, and/or combinations thereof.

Figure 6:
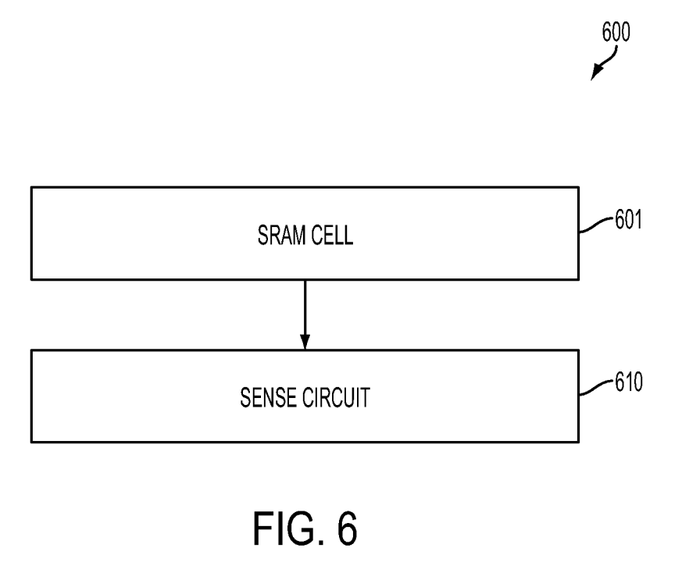
FIG. 6 is a schematic drawing showing a SRAM circuit including a SRAM cell coupled with a sense circuit.

FIG. 6 is a schematic drawing showing a SRAM circuit including a SRAM cell coupled with a sense circuit. In FIG. 6, a SRAM circuit 600 can include a SRAM cell 601 coupled with a sense circuit 610. The SRAM cell 601 can be similar to the SRAM cell 100 described above in conjunction with FIG. 1. The sense circuit 610 can be coupled with the SRAM cell 601 through at least one of the bit lines BL1-BL3. The sense circuit 610 can sense a cell current of the SRAM cell 601 to determine the datum stored within the SRAM cell 601.

In some embodiments, a system can include a processor (not shown) coupled with the SRAM circuit 600. In some embodiments, the processor can be a processing unit, central processing unit, digital signal processor, or other processor that is suitable for accessing data of memory circuit.

The processor and the SRAM circuit 601 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system including the SRAM circuit 600 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) cell comprising:
   a pair of cross-coupled inverters having a first node and a second node;
   a first transistor coupled between the first node and a first bit line;
   a second transistor coupled between the second node and a second bit line;
   a third transistor having a gate coupled with the first node; and
   a fourth transistor coupled between the third transistor and a third bit line,
   the third transistor having a threshold voltage that is higher than that of the fourth transistor by about 10% or more.

2. The SRAM cell of claim 1, wherein the threshold voltage of the third transistor is higher than the threshold voltage of the fourth transistor by about 20% or more.

3. The SRAM cell of claim 1, wherein the threshold voltage of the third transistor is higher than a threshold voltage of a fifth transistor of the pair of cross-coupled inverters by about 10% or more.

4. The SRAM cell of claim 3, wherein the threshold voltage of the fourth transistor is substantially equal to the threshold voltage of the fifth transistor.

5. The SRAM cell of claim 3, wherein the threshold voltage of the fourth transistor is lower than the threshold voltage of the fifth transistor by about 10% or more.

6. The SRAM cell of claim 3, wherein a source of the third transistor and a source of the fifth transistor are coupled to a power node.

7. The SRAM cell of claim 6, wherein the third transistor and the fifth transistor are NMOS transistors.

8. The SRAM cell of claim 1, wherein the third and fourth transistors have different channel dopant concentrations.

9. A static random access memory (SRAM) circuit comprising:
   a sense amplifier; and
   a SRAM cell coupled with the sense amplifier, the SRAM cell comprising:
      a pair of cross-coupled inverters having a first node and a second node;
      a first transistor coupled between the first node and a first bit line;
      a second transistor coupled between the second node and a second bit line;
      a third transistor having a gate coupled with the first node;
      a fourth transistor coupled between the third transistor and a third bit line,
   the third transistor having a threshold voltage that is higher than that of the fourth transistor by about 10% or more.

10. The SRAM circuit of claim 9, wherein the threshold voltage of the third transistor is higher than the threshold voltage of the fourth transistor by about 20% or more.

11. The SRAM circuit of claim 9, wherein the threshold voltage of the third transistor is higher than a threshold voltage of a fifth transistor of the pair of cross-coupled inverters by about 10% or more.

12. The SRAM circuit of claim 11, wherein the threshold voltage of the fourth transistor is substantially equal to the threshold voltage of the fifth transistor.

13. The SRAM circuit of claim 11, wherein the threshold voltage of the fourth transistor is lower than the threshold voltage of the fifth transistor by about 10% or more.

14. The SRAM circuit of claim 9, wherein the third and fourth transistors have different channel dopant concentrations.

15. A memory cell comprising:
   a pair of cross-coupled inverters, comprising:
      a first transistor of a first type, a source of the first transistor coupled to a first power node; and
      a second transistor of a second type, a source of the second transistor coupled to a second power node, a drain of the second transistor coupled to a drain of the first transistor, and a gate of the second transistor coupled to a gate of the first transistor;
   a third transistor of the second type, a source of the third transistor coupled to the second power node, and a gate of the third transistor coupled to the drain of the second transistor; and
   a fourth transistor of the second type, a source of the fourth transistor coupled to a drain of the third transistor, and a drain of the fourth transistor coupled to a bit line, the third transistor having a threshold voltage that is higher than that of the fourth transistor by about 10% or more.

16. The memory cell of claim 15, wherein the threshold voltage of the third transistor is higher than the threshold voltage of the fourth transistor by about 20% or more.

17. The memory cell of claim 15, wherein the threshold voltage of the third transistor is higher than a threshold voltage of the second transistor by about 10% or more.

18. The memory cell of claim 17, wherein the threshold voltage of the fourth transistor is substantially equal to the threshold voltage of the second transistor.

19. The memory cell of claim 17, wherein the threshold voltage of the fourth transistor is lower than the threshold voltage of the second transistor by about 10% or more.

20. The memory cell of claim 15, wherein the third and fourth transistors have different channel dopant concentrations.

* * * * *